US010855223B2

(12) United States Patent
Lee

(10) Patent No.: US 10,855,223 B2
(45) Date of Patent: Dec. 1, 2020

(54) DIFFERENTIAL CIRCUIT WITH CURRENT CONTROL DEVICE

(71) Applicant: SAMSUNG ELECTRO-MECHANICS CO., LTD., Suwon-si (KR)

(72) Inventor: Soo Woong Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/421,812

(22) Filed: May 24, 2019

(65) Prior Publication Data

US 2020/0204114 A1 Jun. 25, 2020

(30) Foreign Application Priority Data

Dec. 20, 2018 (KR) .......................... 10-2018-0166351

(51) Int. Cl.
*H03B 5/12* (2006.01)

(52) U.S. Cl.
CPC ......... *H03B 5/1215* (2013.01); *H03B 5/1228* (2013.01); *H03B 5/1234* (2013.01); *H03B 5/1278* (2013.01)

(58) Field of Classification Search
CPC ....... H03L 5/00; H03B 5/1215; H03B 5/1228; H03B 5/1243
See application file for complete search history.

(56) References Cited

U.S. PATENT DOCUMENTS

| 7,327,201 B2 * | 2/2008 | Miyashita ................. H03L 5/00 331/117 FE |
| 2008/0048795 A1 * | 2/2008 | Hoshino .................... H03L 5/00 331/183 |
| 2013/0285756 A1 | 10/2013 | Chen |
| 2017/0324377 A1 * | 11/2017 | Pereira Da Silva, Jr. ................... H03L 5/00 |

* cited by examiner

*Primary Examiner* — Jeffrey M Shin
(74) *Attorney, Agent, or Firm* — NSIP Law

(57) ABSTRACT

A current control device for a differential circuit is provided. The current control device includes a differential circuit that generates differential signals comprising a positive signal and a negative signal in opposite phases, an amplitude detection circuit detecting an amplitude of the differential signal and outputting first and second detection voltages, an error amplification circuit controlling the differential circuit on the basis of an error voltage between the first and second detection voltages, and a current control circuit controlling the amplitude detection circuit on the basis of any one of the first and second detection voltages.

14 Claims, 8 Drawing Sheets

DIFFERENTIAL CIRCUIT WITH CURRENT CONTROL DEVICE

CROSS-REFERENCE TO RELATED APPLICATION

This application claims the benefit under 35 USC § 119(a) of Korean Patent Application No. 10-2018-0166351 filed on Dec. 20, 2018 in the Korean Intellectual Property Office, the entire disclosure of which is incorporated herein by reference for all purposes.

BACKGROUND

1. Field

The present disclosure relates to a current control device for a differential circuit.

2. Description of Related Art

Generally, systems for processing frequencies require an oscillator to generate a desired specific frequency. Specifications of the oscillator include, among others, oscillation stability, current consumption, noise, and size. Noise may be one of the more important characteristics because it may affect a signal-to-noise (SNR) of the system. Accordingly, it may be beneficial to reduce the noise of the oscillator.

Typically, one of the sources of noise in the oscillator is 1/f noise. 1/f noise is noise introduced from a current source, known to drastically limit noise performance of a circuit. Methods for reducing 1/f noise include methods which connect a capacitor to a current source, and methods which use a large device that may be less affected by 1/f noise.

Another source of noise in the oscillator may be power noise. Generally, the oscillator may utilize a large output swing to improve the SNR. For example, in the example of an LC oscillator, a peak of an output swing may be increased to be larger than a storage voltage due to storage properties of an LC component, and in this example, the output swing may be distorted, and as a power supply voltage and the output swing come into contact with each other, power noise may easily flow into the oscillator. Thus, noise characteristics of the oscillator are negatively affected by power noise.

In view of such disadvantages, an automatic amplitude controlled (AAC) oscillator (OSC) that automatically controls an amplitude may be implemented in order to realize more stable oscillation. The AAC OSC may include an AAC circuit added to an oscillator to achieve more stable oscillation.

However, such an AAC OSC oscillator may achieve stable oscillation, because of a semiconductor process, a temperature change, a current change, and the like, an output amplitude of the oscillator may be excessively high, and may exceed a power supply voltage, and thus, power noise may be introduced. Additionally, when the output amplitude of the oscillator is too low, the SNR deteriorates.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, a control device includes a differential circuit configured to generate differential signals including a positive signal and a negative signal in opposite phases, an amplitude detection circuit configured to detect an amplitude of the differential signals and output a first detection voltage and a second detection voltage, an error amplification circuit configured to control the differential circuit based on an error voltage between the first detection voltage and the second detection voltage; and a current control circuit configured to control the amplitude detection circuit based on any one of the first detection voltage and the second detection voltage.

The current control circuit may be configured to perform a control operation to reduce an internal current of the amplitude detection circuit based on a determination that the amplitude of the differential signals is greater than a magnitude of a power supply voltage that is based on the first and second detection voltages after the current control circuit performs the control operation with a maximum current in a predetermined current range.

The amplitude detection circuit may include a first amplitude detection circuit including a first N channel field effect transistor (FET) and a second N channel field effect transistor each respectively having a drain commonly connected to a power supply voltage terminal, a gate configured to receive a positive signal and a negative signal, and sources connected in common; and a first current source connected between the common sources of the first N channel FET and the second N channel FET and a ground, and the first amplitude detection circuit may be configured to detect a first amplitude of the positive signal, and output the first detection voltage from the common sources of the first N channel FET and the second N channel FET, and a second amplitude detection circuit including a second current source that has a first end connected to the power supply voltage terminal; and a first P channel FET and a second P channel FET each respectively having a source commonly connected to a second end of the second current source in parallel, gates respectively configured to receive a positive signal and a negative signal, and drains connected in common, and configured to detect an amplitude of the negative signal and output the second detection voltage from the common sources of the first P channel FET and the second P channel FET.

The error amplification circuit may include an error amplifier that includes a non-inverting input terminal configured to receive the first detection voltage, an inverting input terminal configured to receive the second detection voltage, and an output terminal configured to output the error voltage corresponding to the difference between the first detection voltage and the second detection voltage, and the error amplifier may be configured to regulate a current regulator based on the error voltage.

The current control circuit may include a reference voltage generation circuit configured to generate a reference voltage, a comparison circuit configured to compare one of the first detection voltage, and the second detection voltage with the reference voltage, and output a comparison voltage that has a level that is based on the comparing, a control circuit configured to generate a control signal based on the level of the comparison voltage; and a variable current source configured to generate a control current based on the generated control signal and control the internal current of the amplitude detection circuit based on the generated control current.

The reference voltage generation circuit may include a third N channel FET including a drain and a gate connected in common with the power supply voltage terminal, and a source connected to an output terminal of the reference voltage generation circuit, and a third current source connected between the source of the third N channel FET and a ground, and wherein the third N channel FET has a structure and a size which are the same as a structure and a size of the first N channel FET of the first amplitude detection circuit, and may be configured to output the reference voltage corresponding to a magnitude of the power supply voltage from the source.

The comparison circuit may include a comparator including a non-inverting input terminal configured to receive the first detection voltage, an inverting input terminal configured to receive the reference voltage, and an output terminal configured to compare the first detection voltage with the reference voltage and output the comparison voltage that has a level that is based on a result of the comparison.

The variable current source may include a first transistor and a fourth current source connected in series between the power supply voltage terminal and the ground, a plurality of current mirror transistors connected in parallel with a control terminal of the first transistor, and connected in parallel between the power supply voltage terminal and a common node, a plurality of switches respectively connected between sources of the plurality of current mirror transistors and the common node, and an output transistor connected between the common node and the ground, and configured to form a current mirror with the first current source of the first amplitude detection circuit to control a current of the first current source.

In the general aspect, current control device includes a current control device including a differential circuit which includes a current regulator and a differential oscillation circuit configured to perform an oscillation operation based on a current regulated by the current regulator, and generate a differential signal that has a positive signal and a negative signal in opposite phases, an amplitude detection circuit configured to detect an amplitude of the differential signal and output a first detection voltage and a second detection voltage, an error amplification circuit configured to control the current regulator based on an error voltage between the first detection voltage and the second detection voltage, and a current control circuit configured to control the amplitude detection circuit based on any one of the first detection voltage and the second detection voltage.

After the current control circuit performs a control operation with a maximum current in a predetermined current range, the current control circuit is configured to perform a control operation to reduce an internal current of the amplitude detection circuit based on a determination that the amplitude of the differential signal is greater than a magnitude of a power supply voltage based on the first detection voltage and the second detection voltage, and the current control circuit is configured to perform a control operation to maintain the internal current of the amplitude detection circuit based on a determination that the amplitude of the differential signal is not greater than the magnitude of a power supply voltage based on the first detection voltage and the second detection voltage.

The amplitude detection circuit may include a first amplitude detection circuit including a first N channel field effect transistor (FET) and a second N channel field effect transistor each respectively having a drain commonly connected to a power supply voltage terminal, a gate configured to receive a positive signal and a negative signal, and sources connected in common; and a first current source connected between the common sources of the first N channel FET and the second N channel FET and a ground, and the first amplitude detection circuit is configured to detect a first amplitude of the positive signal, and output the first detection voltage from the common sources of the first N channel FET and the second N channel FET, and a second amplitude detection circuit including a second current source that has a first end connected to the power supply voltage terminal; a first P channel FET and a second P channel FET each respectively having a source commonly connected to a second end of the second current source in parallel, gates respectively configured to receive a positive signal and a negative signal, and drains connected in common; and configured to detect an amplitude of the negative signal and output the second detection voltage from the common sources of the first P channel FET and the second P channel FET.

The error amplification circuit may include an error amplifier that includes a non-inverting input terminal configured to receive the first detection voltage, an inverting input terminal configured to receive the second detection voltage, and an output terminal configured to output the error voltage corresponding to the difference between the first detection voltage and the second detection voltage, and the error amplifier is configured to regulate the current regulator based on the error voltage.

The current control circuit includes a reference voltage generation circuit configured to generate a reference voltage, a comparison circuit configured to compare one of the first detection voltage and the second detection voltage with the reference voltage, and output a comparison voltage that has a level that is based on the comparing, a control circuit configured to generate a control signal based on the level of the comparison voltage, and a variable current source configured to generate a control current based on the control signal and control the internal current of the amplitude detection circuit based on the control current.

The reference voltage generation circuit may include a third N channel FET including a drain and a gate connected in common with the power supply voltage terminal, and a source connected to an output terminal of the reference voltage generation circuit, and a third current source connected between the source of the third N channel FET and a ground, and wherein the third N channel FET has a structure and a size which are the same as a structure and a size of the first N channel FET of the first amplitude detection circuit, and is configured to output the reference voltage corresponding to a magnitude of the power supply voltage from the source.

The comparison circuit may include a comparator including a non-inverting input terminal configured to receive the first detection voltage, an inverting input terminal configured to receive the reference voltage, and an output terminal configured to compare the first detection voltage with the reference voltage and output the comparison voltage that has a level that is based on a result of the comparison.

The variable current source may include a first transistor and a fourth current source connected in series between the power supply voltage terminal and the ground, a plurality of current mirror transistors connected in parallel with a control terminal of the first transistor, and connected in parallel between the power supply voltage terminal and a common node, a plurality of switches respectively connected between sources of the plurality of current mirror transistors and the common node, and an output transistor connected between the common node and the ground and configured to form a current mirror with the first current source of the first amplitude detection circuit to control a current of the first current source.

Other features and aspects will be apparent from the following detailed description, the drawings, and the claims.

Figure 1:
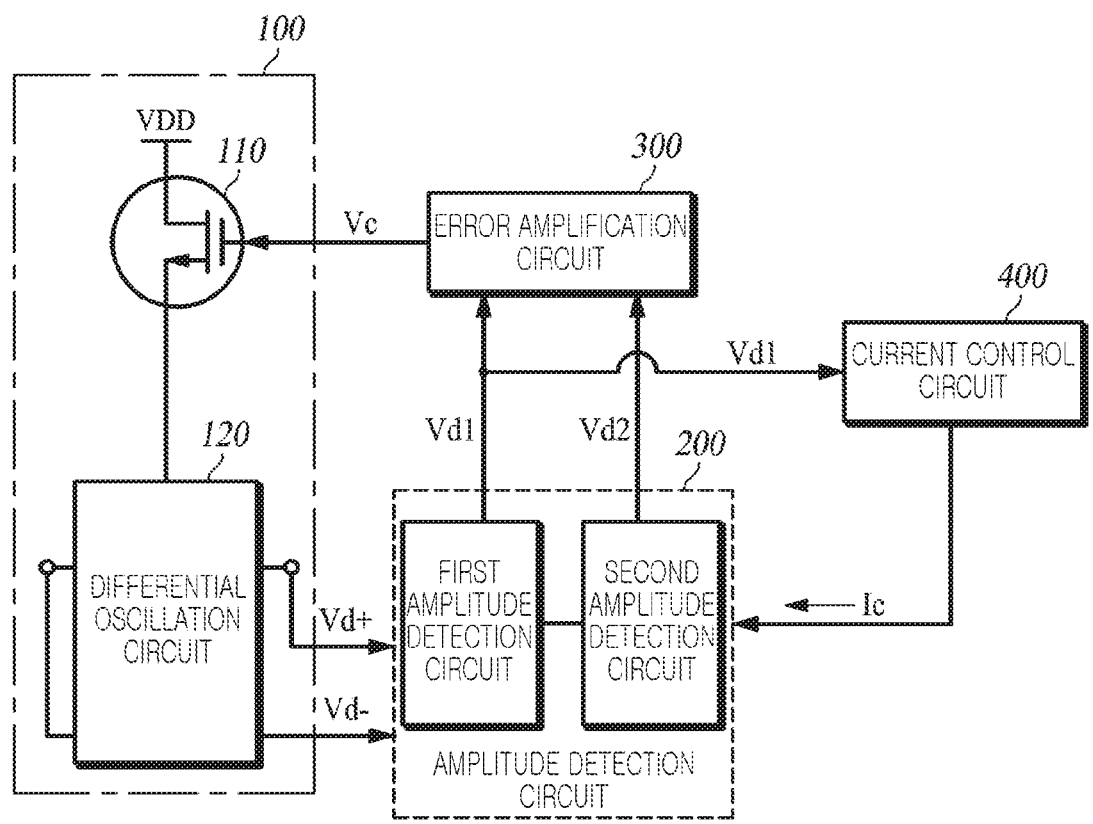
FIG. 1 is a view illustrating an example of a current control device for a differential circuit in accordance with one or more embodiments.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

Unless otherwise defined, all terms, including technical and scientific terms, used herein have the same meaning as commonly understood by one of ordinary skill in the art to which this disclosure pertains after an understanding of the present disclosure. Terms, such as those defined in commonly used dictionaries, are to be interpreted as having a meaning that is consistent with their meaning in the context of the relevant art and the present disclosure, and are not to be interpreted in an idealized or overly formal sense unless expressly so defined herein.

Additionally, in the description of examples, like reference numerals refer to like elements throughout the disclosure of this application, and repeated description related thereto is omitted. Further, detailed description of well-known related structures or functions will be omitted when it is deemed that such description will cause ambiguous interpretation of the present disclosure.

FIG. 1 is a view illustrating an example of a current control device for a differential circuit in accordance with one or more embodiments.

Referring to FIG. 1, a current control device for a differential circuit according to an example may include a differential circuit 100, an amplitude detection circuit 200, an error amplification circuit 300, and a current control circuit 400.

The differential circuit 100 may generate differential signals Vd+ and Vd− having a positive signal Vd+ and a negative signal Vd− in opposite phases. For example, the differential circuit 100 may generate differential signals Vd+ and Vd− having a positive signal Vd+ and a negative signal Vd− in opposite phases. For example, the differential circuit 100 may include, but is not limited to, a differential oscillation circuit or a differential amplifier circuit.

In an example, the differential circuit 100 may include a current regulator 110 and a differential oscillation circuit 120. The current regulator 110 may regulate a current supplied to the differential oscillation circuit 120. The differential oscillation circuit 120 may perform an oscillation operation with the current regulated by the current regulator 110 to generate differential signals Vd+ and Vd− having a positive signal Vd+ and a negative signal Vd− in opposite phases generated according to the oscillation operation.

The amplitude detection circuit 200 may detect amplitudes of the differential signals Vd+ and Vd−, and output first and second detection voltages Vd1 and Vd2.

The error amplification circuit 300 may control the differential circuit 100 based on an error voltage between the first and second detection voltages Vd1 and Vd2.

The current control circuit 400 may control the amplitude detection circuit 200 based on any one (e.g., Vd1) of the first and second detection voltages Vd1 and Vd2.

In the drawings of the present disclosure, unnecessary redundant descriptions of components of the same reference numerals and same functions may be omitted and differences in the drawings will be described.

Figure 2:
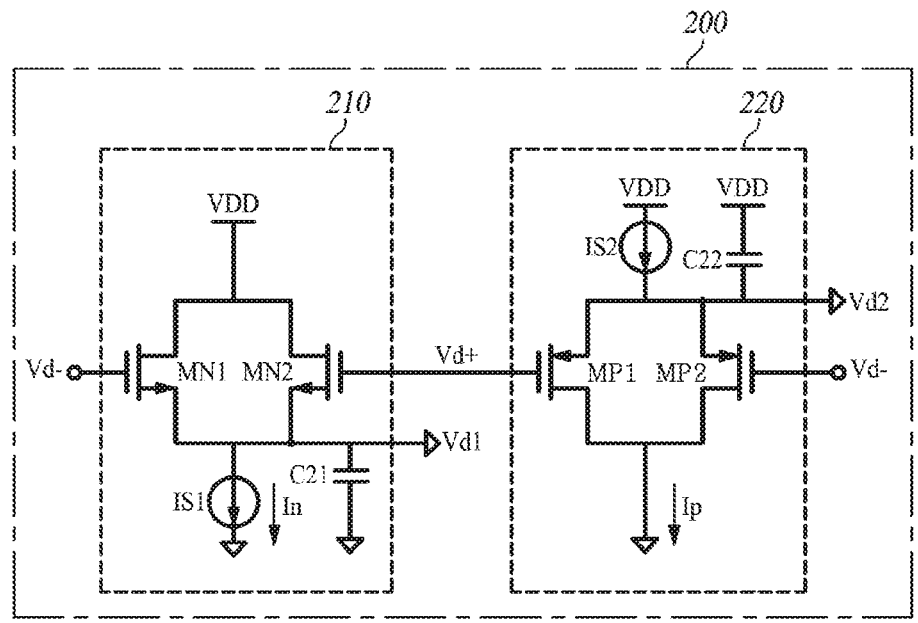
FIG. 2 is a view illustrating an example of an amplitude detection circuit of FIG. 1 in accordance with one or more embodiments.

FIG. 2 illustrates an example of the amplitude detection circuit of FIG. 1.

Referring to FIGS. 1 and 2, the amplitude detection circuit 200 may include a first amplitude detection circuit 210 and a second amplitude detection circuit 220.

The first amplitude detection circuit 210 may include first and second N channel field effect transistors (FETs) MN1 and MN2, and a first current source IS1. The first and second N channel FETs MN1 and MN2 may include drains connected in common to the power supply voltage VDD terminal, gates that receive the positive signal Vd+ and the negative signal Vd−, and sources connected in common, respectively.

The first current source IS1 may be connected between the common sources of the first and second N channel FETs MN1 and MN2 and a ground, and may provide a current $I_n$.

The first amplitude detection circuit 210 may detect a first amplitude of the positive signal Vd+ and output a first detection voltage Vd1 as expressed by Equation 1 below from the common sources of the first and second N channel FETs MN1 and MN2.

$$Vd1 = Vmax - Vgsn \quad \text{Equation 1:}$$

In Equation 1, Vmax is a peak value of the positive signal Vd+, and Vgsn is a gate-power supply voltage of the first N channel FET MN1.

In FIG. 2, C21 is a capacitor, which may bypass noise such as an AC component, or the like, to a ground to stabilize the first detection voltage Vd1.

The second amplitude detection circuit 220 may include a second current source IS2 and first and second P channel FETs MP1 and MP2.

The second current source IS2 may include one end connected to the power supply voltage VDD terminal and the other end connected to a common source of first and second P channel FETs MP1 and MP2.

The first and second P channel FETs MP1 and MP2 may include sources connected in common in parallel to the other end of the second current source IS2, gates receiving a positive signal Vd+ and a negative signal Vd−, and drains connected in common to the ground, respectively.

The second current source IS2 may be connected between the power supply voltage VDD terminal and the common sources of the first and second P channel FETs MP1 and MP2 and provide a current Ip.

The second amplitude detection circuit 220 may detect an amplitude of the negative signal Vd− and output a second detection voltage Vd2 as expressed by Equation 2 below from the common sources of the first and second P channel FETs MP1 and MP2.

$$Vd2 = Vmin - Vgsp \quad \text{Equation 2:}$$

In Equation 2, Vmin is a peak value of the negative signal Vd−, and Vgsp is a gate-power supply voltage of the first P channel FET MP1.

In FIG. 2, C22 is a capacitor, which may bypass noise such as an AC component, or the like, to the ground to stabilize the second detection voltage Vd2.

Figure 3:
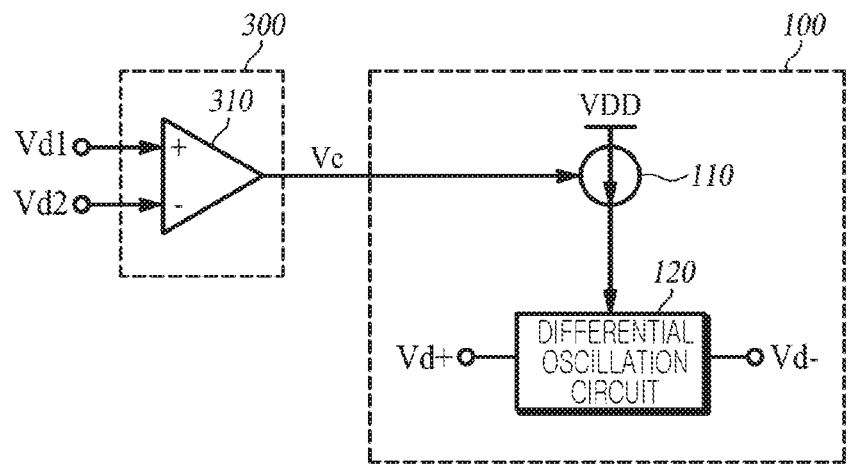
FIG. 3 is a view illustrating an example of an error amplifier circuit of FIG. 1.

FIG. 3 illustrates an example of an error amplifier circuit of FIG. 1.

Referring to FIGS. 1 and 3, an error amplifier circuit 300 may include an error amplifier 310, for example.

The error amplifier 310 may include a non-inverting input terminal that receives the first detection voltage Vd1, an inverting input terminal that receives the second detection voltage Vd2, and an output terminal that outputs an error voltage corresponding to a difference between the first detection voltage Vd1 and the second detection voltage Vd2.

The error amplifier 310 may regulate the current regulator 110 with a control voltage Vc based on the error voltage.

Figure 4:
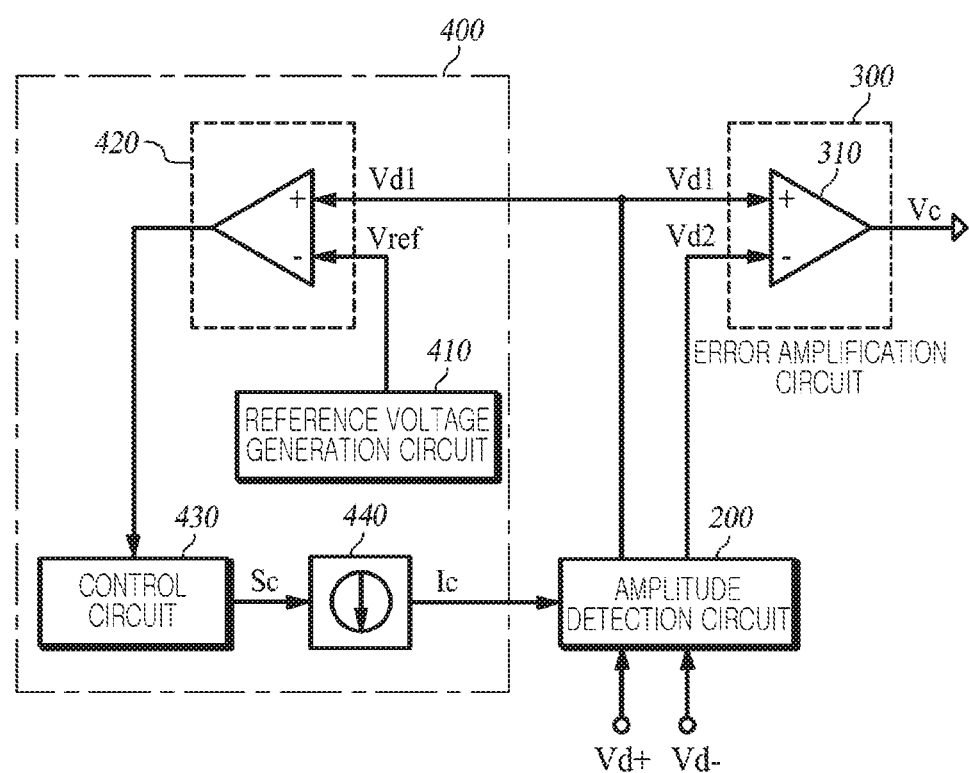
FIG. 4 is a view illustrating an example of a current control circuit of FIG. 1.

FIG. 4 is a view illustrating an example of the current control circuit of FIG. 1.

Referring to FIGS. 1 and 4, the current control circuit 400 may include a reference voltage generation circuit 410, a comparison circuit 420, a control circuit 430, and a variable current source 440.

The reference voltage generation circuit 410 may generate the reference voltage $V_{ref}$.

The comparison circuit 420 may compare one (Vd1 or Vd2) of the first and second detection voltages Vd1 and Vd2 with the reference voltage $V_{ref}$ and output a comparison voltage $V_{comp}$ having a level in accordance with the comparison.

The control circuit 430 may generate a control signal Sc based on the level of the comparison voltage Vcomp. For example, the control signal Sc may be a 2-bit control signal.

The variable current source 440 generates a control current $I_c$ on the basis of the control signal Sc and control an internal current of the amplitude detection circuit 200 using the control current Ic.

Figure 5:
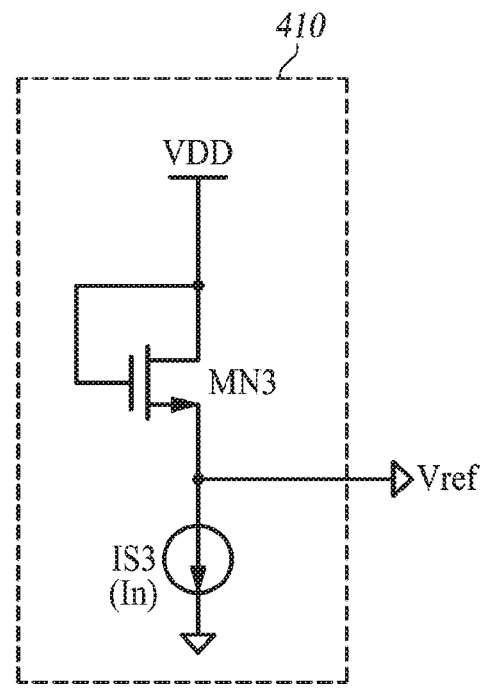
FIG. 5 is a view illustrating an example of a reference voltage generation circuit of FIG. 4.

FIG. 5 illustrates an example of the reference voltage generation circuit of FIG. 4.

Referring to FIGS. 4 and 5, for example, the reference voltage generation circuit 410 may include a third N channel FET MN3 and a third current source IS3.

The third N channel FET MN3 may be a diode-connected field effect transistor. For example, the third N channel FET MN3 may include a drain and a gate connected in common to the power supply voltage VDD terminal and a source connected to an output terminal of the reference voltage generation circuit 410.

The third current source IS3 may be connected between the source of the third N channel FET MN3 and the ground.

The third N channel FET MN3 may have the same structure and size as the structure and size of the first N channel FET MN1, and may have the same characteristics as the characteristics of the first N channel FET MN1, and may output the reference voltage $V_{ref}$ corresponding to a magnitude of the power supply voltage VDD as expressed by Equation 3 below from the source.

$$Vref = VDD - Vgsn \quad \text{Equation 3:}$$

In Equation 3, Vgsn is a gate-power supply voltage of the third N channel FET MN3.

For example, the third N channel FET MN3 of the reference voltage generation circuit 410 may have the same structure and size as the structure and size of the first N channel FET MN1 of the first amplitude detection circuit 210, and a current flowing through the third N channel FET MN3 of the reference voltage generation circuit 410 may be the same as the current $I_n$ provided from the first amplitude detection circuit 210.

Figure 6:
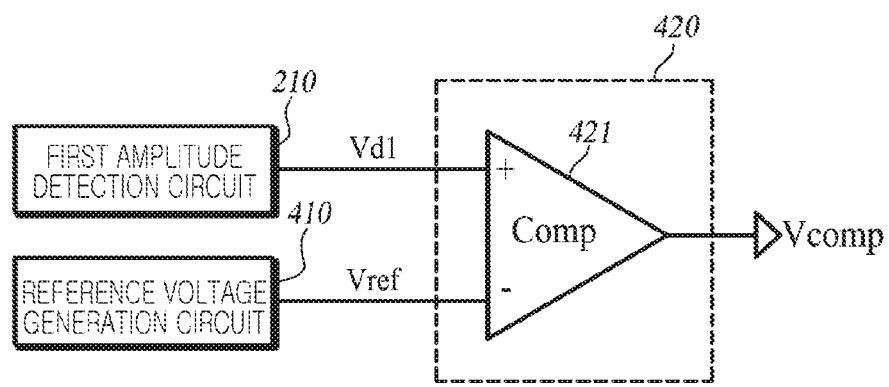
FIG. 6 is a view illustrating an example of a comparison circuit of FIG. 4.

FIG. 6 is an example of the comparison circuit of FIG. 4.

Referring to FIGS. 4 and 6, in an example, the comparison circuit 420 may include a comparator 421.

The comparator 421 may include a non-inverting input terminal that receives the first detection voltage $V_{d1}$, an inverting input terminal that receives the reference voltage $V_{ref}$, and an output terminal that compares the first detection voltage $V_{d1}$ with the reference voltage $V_{ref}$ and outputs a comparison voltage Vcomp that has a level in accordance with the comparison.

For example, when an amplitude of one (e.g., Vd+) of the differential signals Vd+ and Vd− is greater than a magnitude of the power supply voltage VDD (Vd1>Vref), the comparator 410 may output the comparison voltage Vcomp having a high level higher than a reference level. Alternatively, when the amplitude of one (e.g., Vd+) of the differential signals Vd+ and Vd− is not greater than the magnitude of the power supply voltage VDD, the comparator 410 may output the comparison voltage $V_{comp}$ that has a low level lower than the reference level.

Figure 7:
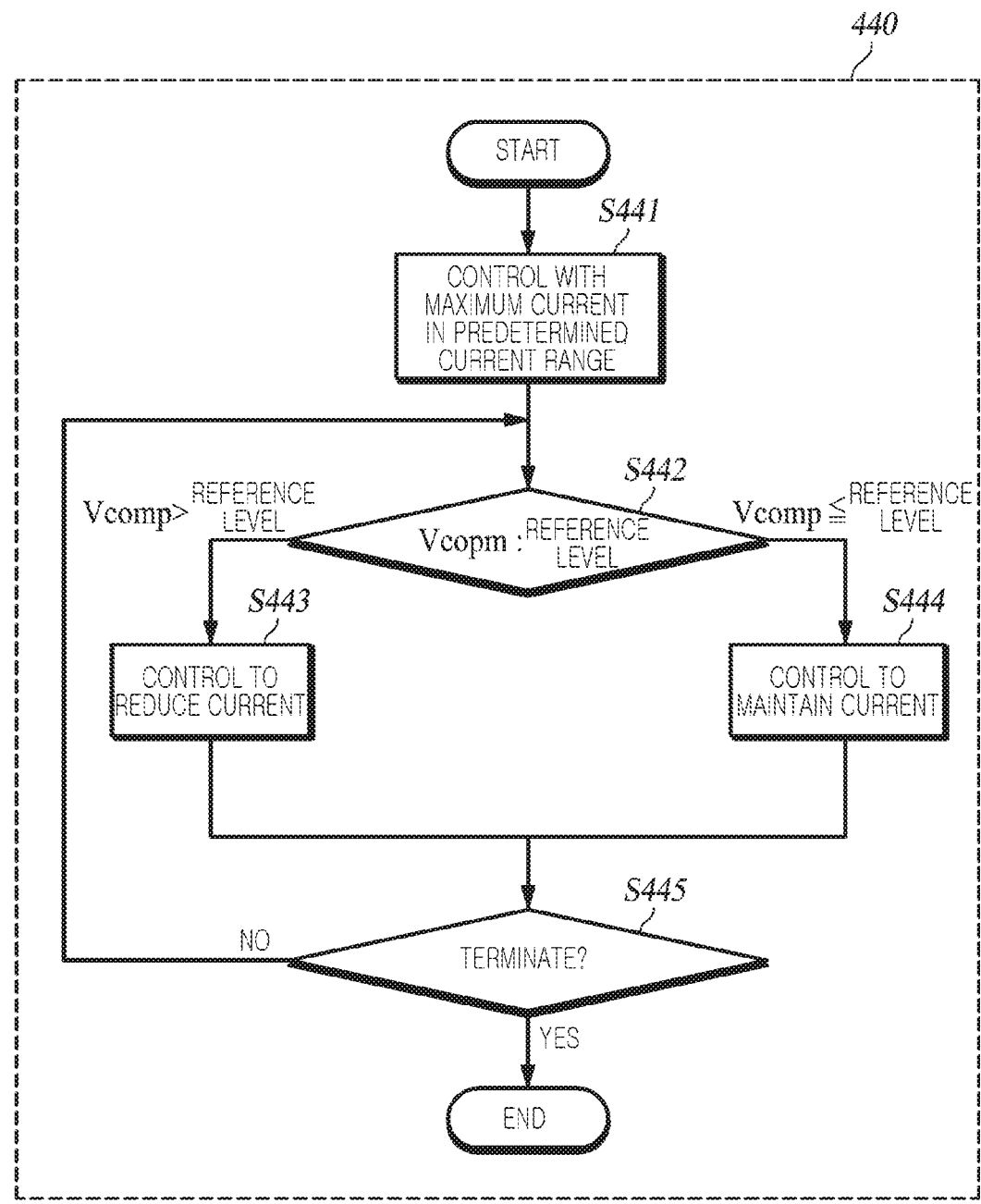
FIG. 7 is a flowchart illustrating an example of a controlling operation of a control circuit of FIG. 4.

FIG. 7 is a flowchart illustrating an example of a controlling operation by the control circuit of FIG. 4.

Referring to FIGS. 4 and 7, after the current control circuit 400 performs controlling with a maximum current in a predetermined current range, if the amplitude of one (e.g., Vd+) of the differential signals Vd+ and Vd− is greater than the magnitude of the power supply voltage VDD based on the first and second detection voltages Vd1 and Vd2, the current control circuit 400 may perform a controlling operation to reduce an internal current of the amplitude detection circuit 200, and if the amplitude of one (e.g., Vd+) of the differential signals Vd+ and Vd− is not greater than the magnitude of the power supply voltage VDD on the basis of the first and second detection voltages Vd1 and Vd2, the current control circuit 400 may perform controlling to maintain the internal current of the amplitude detection circuit 200.

Referring to FIG. 7, the control circuit 430 first generates a control signal Sc to perform a controlling operation with the maximum current in the predetermined current range in operation S441, and thereafter, if the amplitude of one (e.g., Vd+) of the differential signals Vd+ and Vd− is greater than the magnitude of the power supply voltage VDD (Vd+>VDD), that is, if a level of the comparison voltage $V_{comp}$ is a high level higher than a reference level in operation S442, the control circuit 430 may generate the control signal Sc for current reduction in operation S443.

Alternatively, if the amplitude of one (e.g., Vd+) of the differential signals Vd+ and Vd− is not greater than the magnitude of the power supply voltage VDD (Vd+<VDD), that is, if the level of the comparison voltage $V_{comp}$ is a low level lower than the reference level in operation S442, the control circuit 430 may generate the control signal Sc for maintaining the current in operation S444.

The control circuit 430 may repeat the control process of generating the control signal Sc until the control process terminates (operation S445).

In an example, the control circuit 430 may be realized as a logic circuit to generate the comparison voltage $V_{comp}$.

As described above, an upper limit of the predetermined current range may be set such that the magnitude of the differential signals does not exceed the power supply voltage VDD. The reference level may be set based on the power supply voltage VDD or may be arbitrarily set according to a state of an applied system.

Figure 8:
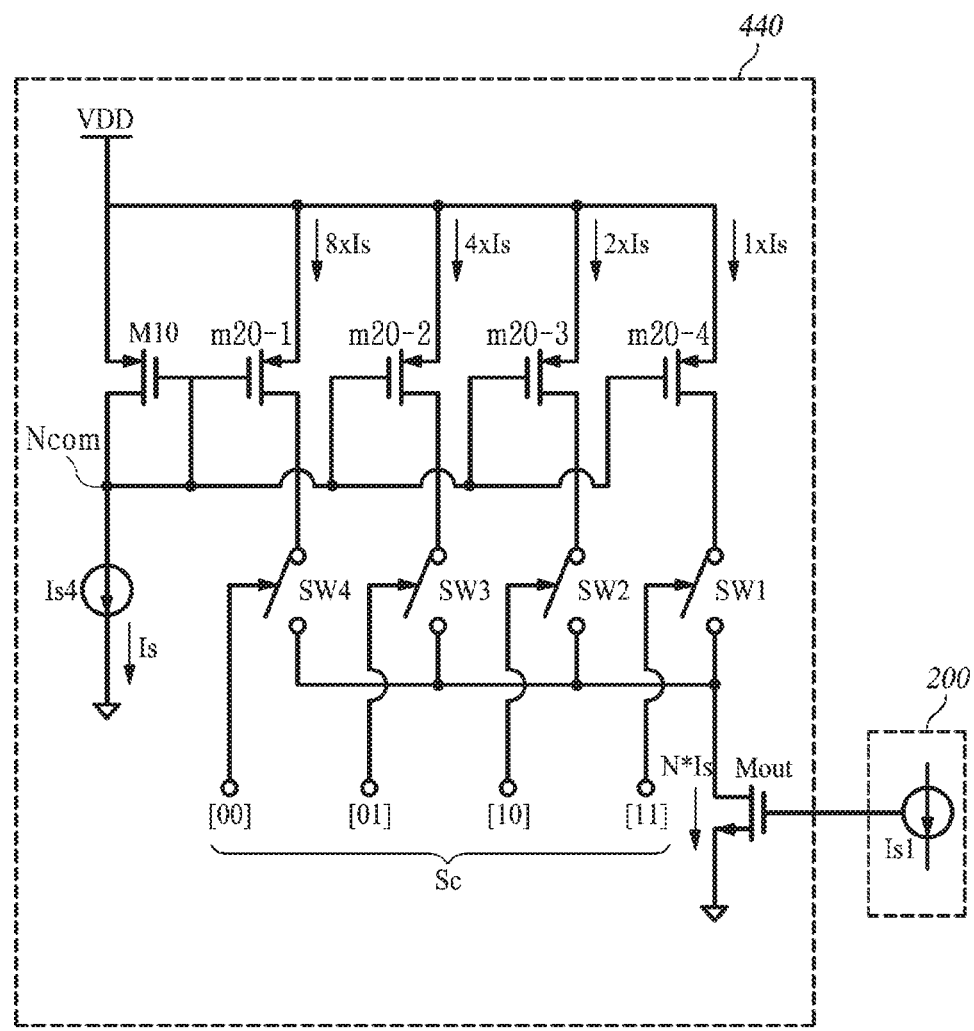
FIG. 8 illustrates an example of a circuit diagram of a variable current source of FIG. 4.

FIG. 8 is a circuit diagram illustrating an example of a variable current source of FIG. 4.

Referring to FIGS. 4 and 8, the variable current source 440 may include a first transistor M10, a fourth current source $I_s4$, a plurality of current mirror transistors M20-1 to M20-4, a plurality of switches SW1 to SW4, and an output transistor Mout.

In the present example, for the purposes of description, an example where the plurality of current mirror transistors M20-1 to M20-4 are four first to fourth current mirror transistors M20-1 to M20-4 and the plurality of switches SW1 to SW4 are four first to fourth switches SW1 to SW4 will be described by way of example, but the present disclosure is not limited thereto.

The first transistor M10 and the fourth current source $I_s4$ may be connected in series between the power supply voltage VDD terminal and the ground. For example, the first transistor M10 may be a field effect transistor (FET), and the fourth current source IS4 may provide a current $I_s$.

The first to fourth current mirror transistors M20-1 to M20-4 may be connected in parallel with a control terminal (e.g., a gate) of the first transistor M10 to form a current mirror circuit, and may be connected in parallel between the power supply voltage VDD terminal and a common node $N_{com}$. The first to fourth current mirror transistors M20-1 to M20-4 may have different sizes, and thus, when the first to fourth current mirror transistors M20-1 to M20-4 are turned on, they may provide different currents (e.g., $8*I_s$, $4*I_s$, $2*I_s$, or $1*I_s$).

For example, the first current mirror transistor M20-1 may have the same size as the first transistor M10, and thus provide the same current $1 \times I_s$ as the current $I_s$ flowing through the first transistor M10. The second current mirror transistor M20-2 may be twice the size of the first transistor M10 and may provide a current ($2 \times I_s$) which is double the current $I_s$ flowing through the first transistor M10. The third current mirror transistor M20-3 may be four times the size of the first transistor M10 and provide a current $4 \times I_s$ which is quadruple the current $I_s$ flowing through the first transistor M10. The fourth current mirror transistor M20-4 may be 8 times larger than the size of the first transistor M10 and provide a current ($8 \times I_s$) which is 8 times the current Is flowing through the first transistor M10.

The first to fourth switches SW1 to SW4 may be connected between sources of the first to fourth current mirror transistors M20-1 to M20-4 and the common node $N_{com}$, respectively.

For example, the first to fourth switches SW1 to SW4 may be switched to an ON state or an OFF state according to a 2-bit control signal Sc. For example, when the two bits of the control signal Sc are [00], the fourth switch SW4 may be turned on, when the two bits of the control signal Sc are [01], the third switch SW3 may be turned on, when the two bits of the control signal Sc are [10], the second switch SW2 may be turned on, and when the two bits of the control signal Sc are [11], the first switch SW1 may be turned on.

For example, at an initial stage of operation, the two bits of the control signal Sc are [00] and the fourth switch SW4 is turned on to output the largest current (e.g., $8 \times I_s$), and thereafter, when the amplitude of one (e.g., Vd+) of the differential signals Vd+ and Vd− exceeds the magnitude of the power supply voltage VDD, the current may be reduced by stages.

The output transistor Mout may be connected between the common node $N_{co}m$ and the ground, and may form a current mirror with the first current source IS1 of the first amplitude detection circuit 210 to control a current from the first current source IS1.

For example, at the initial stage of operation, two bits of the control signal Sc may be set to [00] to turn on the fourth switch SW4 to output the largest current (e.g., 8×I$_s$), and in an example, if an output amplitude also increases due to the large current to generate an output signal of an oscillator exceeding the power supply voltage, then, in a following operation, the amplitude of one (e.g., Vd+) of the differential signals Vd+ and Vd− may increase to be larger than the magnitude of the power supply voltage VDD (Vd1>Vref), the comparison voltage Vcomp may have a high level, the third switch SW3 providing a current smaller by one level than the fourth switch SW4 may be controlled to be turned on based on the control signal Sc, and accordingly, the current may be reduced by one level.

If the magnitude of the differential signal of the differential circuit 100 is slightly reduced but higher than the power supply voltage, the amplitude of the differential signal Vd+ may be larger than the magnitude of the power supply voltage VDD (Vd1>Vref). In this example, the comparison voltage V$_{comp}$ may have a high level and the second switch SW2 that provides a current smaller by one level than the third switch SW3 may be controlled to be turned on based on the control signal Sc. As a result, the current is reduced by one level.

In this example, if the magnitude of the differential signal of the differential circuit 100 is reduced to be smaller than the power supply voltage due to the reduced current, the comparison voltage Vcomp may have a low level so that the second switch SW2 may be controlled to be maintained in the ON state.

As described above, when the amplitude of one (e.g., Vd+) of the differential signals Vd+ and Vd− is greater than the magnitude of the power supply voltage VDD, that is, when the level of the comparison voltage Vcomp is a high level higher than the reference level, the control circuit 430 may perform a controlling operation to reduce the current with the control signal Sc, and when the amplitude of one (e.g., Vd+) of the differential signals Vd+ and Vd− is not greater than the magnitude of the power supply voltage VDD, that is, when the level of the comparison voltage V$_{comp}$ is a low level lower than the reference level, the control circuit 430 may perform controlling to maintain the current using the control signal Sc.

Figure 9:
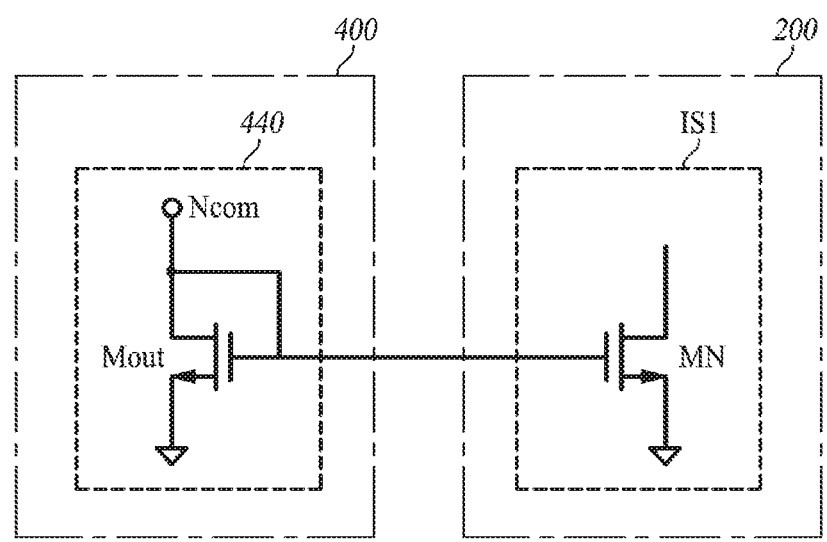
FIG. 9 is a view illustrating an example of connection between a variable current source and a first current source of FIG. 4.

FIG. 9 is a view illustrating an example of a connection between the variable current source of FIG. 4 and the first current source.

Referring to FIGS. 4 and 9, in an example, the first current source I$_{S1}$ included in the first amplitude detection circuit 210 of the amplitude detection circuit 200 may include an N channel FET MN.

The output transistor Mout included in the variable current source 440 of the current control circuit 400 may form a current mirror with the N channel FET MN of the first current source I$_{S1}$.

Accordingly, the current (e.g., 8*I$_s$, 4*I$_s$, 2*I$_s$, or 1*I$_s$) flowing through the output transistor Mout may be mirrored to the N channel FET MN of the first current source I$_{S1}$, and thus, the N channel FET MN may provide a current in accordance with a magnitude ratio of the output transistor Mout and the N channel FET MN.

Figure 10:
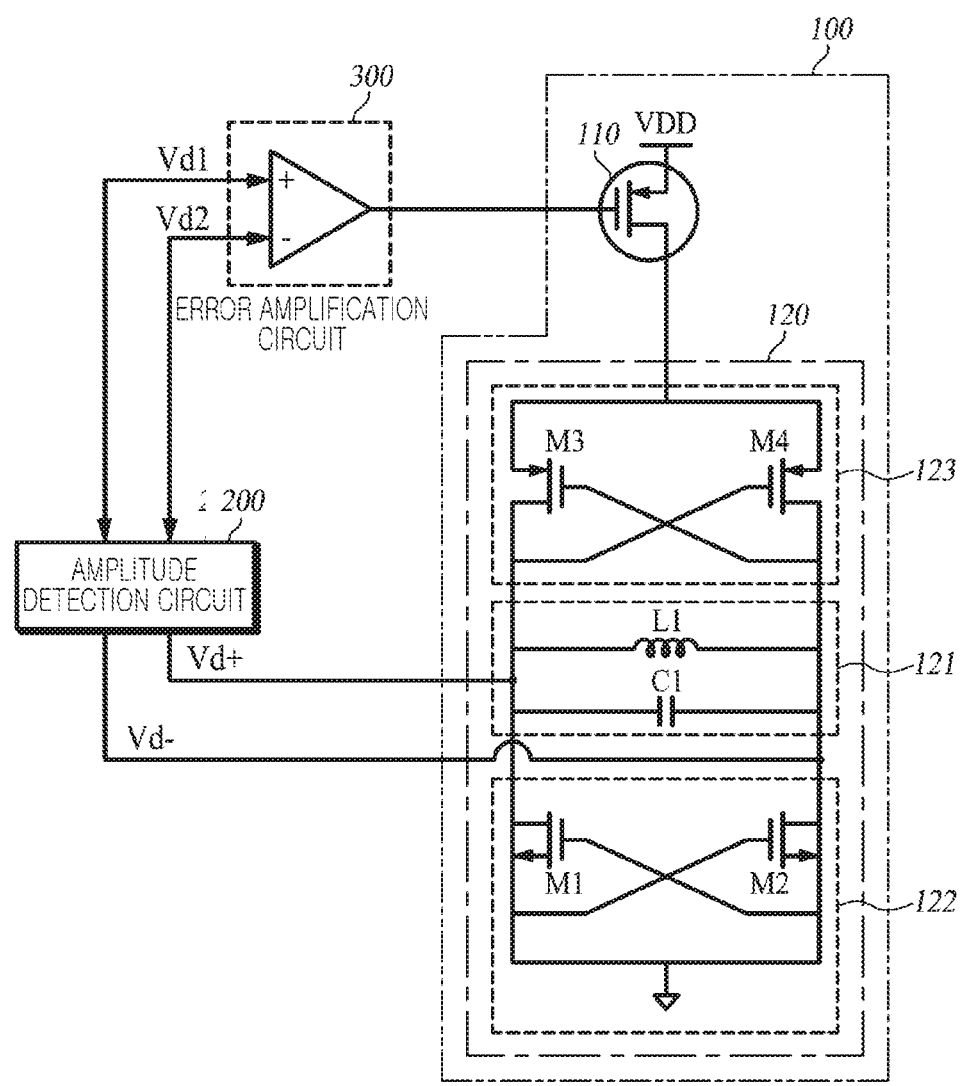
FIG. 10 is a view illustrating an example of a differential circuit of FIG. 1.

FIG. 10 illustrates an example of the differential circuit of FIG. 1.

Referring to FIG. 10, the differential circuit 100 may include the current regulator 110 and the differential oscillation circuit 120 as described above.

In a non-limiting example, the differential oscillation circuit 120 may be replaced with a differential signal generation circuit to generate a differential signal. In this example, the differential signal generation circuit may include at least one of a differential oscillation circuit and a differential amplification circuit.

The differential circuit 100 may operate as an automatic amplitude controlled (AAC) OSC together with the amplitude detection circuit and the error amplifier circuit 300.

In an example, the differential oscillation circuit 120 may include a resonance circuit 121, and may include at least one of the first and second oscillation circuits 122 and 123.

The resonant circuit 121 may include a capacitor C1 and a coil L1 connected in parallel. The first oscillation circuit 122 may include two gate-drain cross coupled N channel transistors M1 and M2 between the resonance circuit 121 and the ground. The second oscillation circuit 123 may include two gate-drain cross coupled P channel transistors M3 and M4 between the resonance circuit 121 and the current regulator 110.

As described above, since the AAC OSC oscillates at a constant amplitude, oscillation of the differential oscillation circuit may be stabilized and the differential oscillation circuit may be stably oscillated at a desired amplitude level (Vpeak to peak).

Since the SNR is a certain level or higher through controlling of the amplitude level, an output signal from the differential oscillation circuit does not directly come into contact with noise of the power supply voltage, ensuring excellent noise characteristics of the differential oscillation circuit.

Meanwhile, the current control device for a differential circuit according to an example may be realized in a computing environment in which a processor (e.g., a central processing unit (CPU), a graphics processing unit (GPU), a microprocessor, an application specific integrated circuit (ASIC), a field programmable gate array (FPGA), etc.), a memory (e.g., a volatile memory (e.g., RAM), etc.), a nonvolatile memory (e.g., a ROM, a flash memory, etc.), and the like, are interconnected (e.g., peripheral component interconnect (PCI), a USB, firmware (IEEE 1394), optical bus architecture, a network, etc.) are connected to each other, and is not limited thereto.

As set forth above, according to various examples, since the amplitude of the differential signal output from the differential circuit may be automatically regulated not to exceed the power supply voltage, an introduction of power noise may be interrupted and the SNR may be improved.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A current control device comprising:
   a differential circuit configured to generate differential signals comprising a positive signal and a negative signal in opposite phases;
   an amplitude detection circuit configured to detect an amplitude of the differential signals and output a first detection voltage and a second detection voltage;
   an error amplification circuit configured to control the differential circuit based on an error voltage between the first detection voltage and the second detection voltage; and
   a current control circuit configured to control the amplitude detection circuit based on any one of the first detection voltage and the second detection voltage,
   wherein, subsequent to the current control circuit performing a control operation with a maximum current, an internal current of the amplitude detection circuit is reduced by the current control circuit if the amplitude of the differential signals is greater than a magnitude of a power voltage supply.

2. The device of claim 1, wherein the amplitude detection circuit comprises:
   a first amplitude detection circuit comprising a first N channel field effect transistor (FET) and a second N channel field effect transistor each respectively having a drain commonly connected to a power supply voltage terminal, a gate configured to receive a positive signal and a negative signal, and sources connected in common; and a first current source connected between the common sources of the first N channel FET and the second N channel FET and a ground, and the first amplitude detection circuit is configured to detect a first amplitude of the positive signal, and output the first detection voltage from the common sources of the first N channel FET and the second N channel FET; and
   a second amplitude detection circuit comprising a second current source that has a first end connected to the power supply voltage terminal; and a first P channel FET and a second P channel FET each respectively having a source commonly connected to a second end of the second current source in parallel, gates respectively configured to receive a positive signal and a negative signal, and drains connected in common, and configured to detect an amplitude of the negative signal and output the second detection voltage from the common sources of the first P channel FET and the second P channel FET.

3. The device of claim 2, wherein the error amplification circuit comprises an error amplifier that comprises a non-inverting input terminal configured to receive the first detection voltage, an inverting input terminal configured to receive the second detection voltage, and an output terminal configured to output the error voltage corresponding to the difference between the first detection voltage and the second detection voltage, and
   the error amplifier is configured to regulate a current regulator based on the error voltage.

4. The device of claim 3, wherein the current control circuit comprises:
   a reference voltage generation circuit configured to generate a reference voltage;
   a comparison circuit configured to compare one of the first detection voltage, and the second detection voltage with the reference voltage, and output a comparison voltage that has a level that is based on the comparing;
   a control circuit configured to generate a control signal based on the level of the comparison voltage; and
   a variable current source configured to generate a control current based on the generated control signal and control the internal current of the amplitude detection circuit based on the generated control current.

5. The device of claim 4, wherein the reference voltage generation circuit comprises:
   a third N channel FET comprising a drain and a gate connected in common with the power supply voltage terminal, and a source connected to an output terminal of the reference voltage generation circuit; and
   a third current source connected between the source of the third N channel FET and a ground, and
   wherein the third N channel FET has a structure and a size which are the same as a structure and a size of the first N channel FET of the first amplitude detection circuit, and is configured to output the reference voltage corresponding to a magnitude of the power supply voltage from the source.

6. The device of claim 5, wherein the comparison circuit comprises a comparator comprising a non-inverting input terminal configured to receive the first detection voltage, an inverting input terminal configured to receive the reference voltage, and an output terminal configured to compare the first detection voltage with the reference voltage and output the comparison voltage that has a level that is based on a result of the comparison.

7. The device of claim 5, wherein the variable current source comprises:
   a first transistor and a fourth current source connected in series between the power supply voltage terminal and the ground;
   a plurality of current mirror transistors connected in parallel with a control terminal of the first transistor, and connected in parallel between the power supply voltage terminal and a common node;
   a plurality of switches respectively connected between sources of the plurality of current mirror transistors and the common node; and
   an output transistor connected between the common node and the ground, and configured to form a current mirror with the first current source of the first amplitude detection circuit to control a current of the first current source.

8. A current control device comprising:
   a differential circuit which comprises a current regulator and a differential oscillation circuit configured to perform an oscillation operation based on a current regulated by the current regulator, and generate a differential signal that has a positive signal and a negative signal in opposite phases;
   an amplitude detection circuit configured to detect an amplitude of the differential signal and output a first detection voltage and a second detection voltage;
   an error amplification circuit configured to control the current regulator based on an error voltage between the first detection voltage and the second detection voltage; and
   a current control circuit configured to control the amplitude detection circuit based on any one of the first detection voltage and the second detection voltage,
   wherein, subsequent to the current control circuit performing a control operation with a maximum current, an internal current of the amplitude detection circuit is reduced by the current control circuit if the amplitude of the differential signal is greater than a magnitude of a power voltage supply, and an internal current of the amplitude detection circuit is maintained by the current control circuit if the amplitude of the differential signal is less than the magnitude of the power voltage supply.

9. The device of claim 8, wherein the amplitude detection circuit comprises:
a first amplitude detection circuit comprising a first N channel field effect transistor (FET) and a second N channel field effect transistor each respectively having a drain commonly connected to a power supply voltage terminal, a gate configured to receive a positive signal and a negative signal, and sources connected in common; and a first current source connected between the common sources of the first N channel FET and the second N channel FET and a ground, and the first amplitude detection circuit is configured to detect a first amplitude of the positive signal, and output the first detection voltage from the common sources of the first N channel FET and the second N channel FET; and
a second amplitude detection circuit comprising a second current source that has a first end connected to the power supply voltage terminal; a first P channel FET and a second P channel FET each respectively having a source commonly connected to a second end of the second current source in parallel, gates respectively configured to receive a positive signal and a negative signal, and drains connected in common; and configured to detect an amplitude of the negative signal and output the second detection voltage from the common sources of the first P channel FET and the second P channel FET.

10. The device of claim 9, wherein the error amplification circuit comprises an error amplifier that comprises a non-inverting input terminal configured to receive the first detection voltage, an inverting input terminal configured to receive the second detection voltage, and an output terminal configured to output the error voltage corresponding to the difference between the first detection voltage and the second detection voltage, and
the error amplifier is configured to regulate the current regulator based on the error voltage.

11. The device of claim 10, wherein the current control circuit comprises:
a reference voltage generation circuit configured to generate a reference voltage;
a comparison circuit configured to compare one of the first detection voltage and the second detection voltage with the reference voltage, and output a comparison voltage that has a level that is based on the comparing;
a control circuit configured to generate a control signal based on the level of the comparison voltage; and
a variable current source configured to generate a control current based on the control signal and control the internal current of the amplitude detection circuit based on the control current.

12. The device of claim 11, wherein the reference voltage generation circuit comprises:
a third N channel FET comprising a drain and a gate connected in common with the power supply voltage terminal, and a source connected to an output terminal of the reference voltage generation circuit; and
a third current source connected between the source of the third N channel FET and a ground, and
wherein the third N channel FET has a structure and a size which are the same as a structure and a size of the first N channel FET of the first amplitude detection circuit, and is configured to output the reference voltage corresponding to a magnitude of the power supply voltage from the source.

13. The device of claim 12, wherein:
the comparison circuit comprises a comparator comprising a non-inverting input terminal configured to receive the first detection voltage, an inverting input terminal configured to receive the reference voltage, and an output terminal configured to compare the first detection voltage with the reference voltage and output the comparison voltage that has a level that is based on a result of the comparison.

14. The device of claim 12, wherein the variable current source comprises:
a first transistor and a fourth current source connected in series between the power supply voltage terminal and the ground;
a plurality of current mirror transistors connected in parallel with a control terminal of the first transistor, and connected in parallel between the power supply voltage terminal and a common node;
a plurality of switches respectively connected between sources of the plurality of current mirror transistors and the common node; and
an output transistor connected between the common node and the ground and configured to form a current mirror with the first current source of the first amplitude detection circuit to control a current of the first current source.

* * * * *